(12) United States Patent
Akamatsu

(10) Patent No.: US 7,256,868 B2
(45) Date of Patent: Aug. 14, 2007

(54) PROJECTION EXPOSURE APPARATUS, DEVICE MANUFACTURING METHOD, AND SENSOR UNIT

(75) Inventor: Takahiro Akamatsu, Kuki (JP)

(73) Assignee: Canon Kabushiki Kaisha, Tokyo (JP)

( * ) Notice: Subject to any disclaimer, the term of this patent is extended or adjusted under 35 U.S.C. 154(b) by 328 days.

(21) Appl. No.: 11/052,088

(22) Filed: Feb. 8, 2005

(65) Prior Publication Data
US 2005/0200815 A1    Sep. 15, 2005

(30) Foreign Application Priority Data
Feb. 9, 2004  (JP)  ............................. 2004-032450

(51) Int. Cl.
*G03B 27/42* (2006.01)
*G03B 27/72* (2006.01)

(52) U.S. Cl. .......................................... 355/53; 355/69

(58) Field of Classification Search ................. 355/53, 355/55, 67–71; 250/221–225; 356/317
See application file for complete search history.

(56) References Cited

U.S. PATENT DOCUMENTS

| | | | |
|---|---|---|---|
| 3,903,413 A | 9/1975 | Manning | 250/226 |
| 4,480,910 A * | 11/1984 | Takanashi et al. | 355/30 |
| 4,853,880 A | 8/1989 | Akamatsu et al. | |
| 4,887,904 A | 12/1989 | Nakazato et al. | |
| 5,162,642 A | 11/1992 | Akamatsu et al. | |
| 5,258,823 A | 11/1993 | Akamatsu | |
| 6,784,432 B2 | 8/2004 | Wieczorek | 250/367 |
| 7,213,963 B2 | 5/2007 | Lof et al. | 366/53 |
| 2002/0079455 A1 | 6/2002 | Wieczorek | 250/367 |
| 2002/0081760 A1 | 6/2002 | Whatmore | 438/25 |
| 2002/0101574 A1 * | 8/2002 | Tsuji | 355/69 |
| 2005/0078287 A1 | 4/2005 | Sengers et al. | 355/30 |
| 2005/0146693 A1 | 7/2005 | Ohsaki | 355/30 |
| 2005/0243328 A1 | 11/2005 | Wegmann et al. | 356/520 |

(Continued)

FOREIGN PATENT DOCUMENTS

EP    1 486 828 A2    12/2004

(Continued)

OTHER PUBLICATIONS

Korean Office Action dated Oct. 2, 2006, issued in corresponding Korean patent application No. 10-2005-0011076, with English translation.

(Continued)

*Primary Examiner*—Henry Hung Nguyen
(74) *Attorney, Agent, or Firm*—Fitzpatrick, Cella, Harper & Scinto

(57) ABSTRACT

A projection exposure apparatus which has a projection optical system and projects a pattern onto a substrate through the projection optical system. The apparatus includes a sensor unit which includes a light-receiving element for detecting light incident through the projection optical system, a vessel in which the light receiving element is arranged, a sealing window which transmits the incident light and seals the vessel, and a driving mechanism which aligns the substrate. A space between the sealing window and the light-receiving element is filled with a liquid having a refractive index which is greater than one, and the liquid also serves as a coolant for cooling the driving mechanism.

6 Claims, 15 Drawing Sheets

U.S. PATENT DOCUMENTS

| | | |
|---|---|---|
| 2005/0264778 A1 | 12/2005 | Lof et al. .................... 355/53 |
| 2006/0170891 A1 | 8/2006 | Nishinaga et al. ............ 355/53 |
| 2006/0181690 A1 | 8/2006 | Nishinaga et al. ............ 355/53 |

FOREIGN PATENT DOCUMENTS

| | | |
|---|---|---|
| EP | 1 670 043 A2 | 6/2006 |
| JP | 2-47515 | 2/1990 |
| JP | 6-124873 | 5/1994 |
| JP | 10-303114 | 11/1998 |
| JP | 11-297615 | 10/1999 |
| JP | 2001-281050 | 10/2001 |
| JP | 2002-5737 | 1/2002 |
| JP | 2005-129914 | 5/2005 |
| JP | 2005-175034 | 6/2005 |
| JP | 2005-268744 | 9/2005 |
| KR | 10-2006-0083214 | 7/2006 |
| WO | WO 99/39375 | 8/1999 |
| WO | WO99/49504 * | 9/1999 |
| WO | WO 2004/057295 A2 | 7/2004 |

OTHER PUBLICATIONS

European Search Report dated Aug. 18, 2006, issued in corresponding European patent application No. EP 05 00 2611, forwarded in a Communication dated Sep. 1, 2006.

Japanese Office Action dated May 8, 2006, issued in corresponding Japanese patent application No. 2004-032450.

* cited by examiner

PROJECTION EXPOSURE APPARATUS, DEVICE MANUFACTURING METHOD, AND SENSOR UNIT

FIELD OF THE INVENTION

The present invention relates to a projection optical exposure apparatus, a device manufacturing method, and a sensor unit.

BACKGROUND OF THE INVENTION

Along with micropatterning of a semiconductor element, an exposure light source shifts from a high-pressure mercury lamp of a g-line to a light source of an i-line having a shorter wavelength, and further shifts to KrF and ArF excimer lasers having shorter wavelengths. Also, in order to increase resolution, the NA (numerical aperture) of a projection lens must be increased. Hence, the depth of focus tends to be reduced. As is known well, these relationships are expressed by:

$$(\text{resolution}) = k \cdot (\lambda/NA); \text{ and}$$

$$(\text{depth of focus}) = \pm k2 \cdot \lambda/NA^2,$$

where $\lambda$ represents the wavelength of light used for exposure, NA represents the NA (numerical aperture) of the projection lens, and k1 and k2 represent coefficients for a process.

Recently, KrF and ArF excimer lasers with short wavelengths have been used. Also, an $F_2$ excimer laser, an EUV light source, and an X-ray source are examined for use. Alternatively, the technique for increasing the resolution and the depth of focus by a phase-shift mask, modified illumination, or the like, is practically used. However, the cost of the apparatus increases when using the $F_2$ excimer laser, EUV light source, and X-ray source.

An immersion technique has been attempted to be applied to the projection exposure apparatus, which uses the existing ArF excimer laser. Note that in this immersion method, the space between the projection lens and the wafer is filled with a liquid with a high refractive index to increase the resolution and the depth of focus. For example, the immersion-type projection exposure apparatus is disclosed in Japanese Patent Laid-Open No. 06-124873.

More specifically, in the immersion technique, as shown in FIG. 13, the space between a wafer 2 and an optical element 7, which is the last stage of the projection lens, is filled with a liquid 26. Assume that the wavelength of the exposure light in the air is $\lambda 0$, the refractive index of the liquid 25 used for immersion with respect to the air is n, the convergent half-angle of a light ray is $\alpha$, and $NA0 = \sin \alpha$. The resolution and the depth of focus obtained by using the immersion technique is expressed by:

$$(\text{resolution}) = k1 \cdot (\lambda 0/n)/NA0; \text{ and}$$

$$(\text{depth of focus}) = \pm k2 \sim (\lambda 0/n)/(NA0)^2.$$

That is, the immersion effect is equivalent to setting an exposure wavelength to 1/n. In other words, when designing projection optical systems with the same NA, the depth of focus can be n times by the immersion technique. This immersion technique can be applied to all pattern shapes, and used in combination with the phase-shift mask technique, the modified illumination technique, or the like.

In order to utilize this effect, the purity, uniformity, temperature, and the like, of the liquid must be accurately managed. In the exposure apparatus which sequentially exposes the wafer in a step-and-repeat operation, it is important to minimize the flow and oscillation of the liquid during the operation, and to eliminate air bubbles left on the wafer surface when loading the wafer in the liquid.

In a general projection exposure apparatus, which does not use the immersion technique, an illuminance unevenness sensor, which measures the illuminance and the illuminance unevenness of the exposure light irradiating the wafer, is generally disposed near the wafer. Also, a sensor, which measures the magnification and the focal position variation of the projection lens for calibration, is generally arranged near the wafer.

As a sensor unit for calibration, a light-receiving element is sometimes arranged under silica glass on which a reference mark pattern is formed by chromium, and the like, as shown in FIG. 4. Such a sensor unit is used, as will be described below. That is, a pattern similar to the reference mark in FIG. 4 is formed on a reticle. This pattern is projected on a reference mark, and the light-receiving element measures a light amount transmitted through the reference mark. When an in-focus state is set, the projection image of the pattern formed on the reticle matches the pattern of the reference mark. The light amount detected by the light-receiving element becomes maximum. In an out-of-focus state, the pattern formed on the reticle is blurred, and the blurred pattern is projected on the mark pattern. The light amount detected by the light-receiving element is reduced. Therefore, the focus varies while detecting the light amount by using the light-receiving element. The focus calibration can be performed by detecting the in-focus position where the light amount becomes maximum.

When the reference mark is displaced in the X and Y directions with respect to the pattern projection image on the reticle, the detected light amount changes accordingly. Therefore, the shifts in the X and Y directions can also be detected. That is, this sensor unit can be used as an alignment sensor unit. In addition to this, for example, a line sensor, which includes many pixels for measuring exposure unevenness in a shot and measuring an effective light source, and a two-dimensional CCD for measuring the aberration of the projection lens, may be disposed on a wafer stage.

In consideration of measurement precision, and the like, this sensor unit is preferably used in a state (immersion state) wherein the space under the projection lens is filled with the liquid as in the wafer, in the immersion-type projection exposure apparatus.

However, when using the above-described sensor unit in the immersion state, the following problems will occur.

FIG. 12 shows a conventional illuminance unevenness sensor unit. In the illuminance unevenness sensor unit, a light-receiving element 23 is arranged in a sensor vessel 22 sealed by a sealing window 21. A light-shielding member 28, which has a pinhole, is arranged on the sealing window 21. The light-receiving element 23 is arranged on the sealed space to prevent the characteristics of the light-receiving element 23 from degrading due to humidity, and the like. When the light is applied to the sensor unit having this structure, as is known by Snell's law, the light is refracted at an interface between the air and the sealing window 21, and an interface between the sealing window 21 and the internal space of the sensor unit.

Assume that the refractive index of the outer space of the sensor unit is nil, the refractive index of the sealing window 21 is n2, the refractive index of the internal space of the sensor unit is n3, the incident angle and refractive angle of the light at the interface between the outer space of the sensor unit and the sealing window 21 are θi1 and θr1, respectively, and the incident angle and the refractive angle of the light at the surface between the sealing window 21 and the internal space of the sensor unit are θi2 and θr2, respectively. The following equation is established by Snell's law:

$$n2 \cdot \sin(\theta i2) = n3 \cdot \sin(\theta r2).$$

Therefore, $$\sin(\theta r2) = (n2/n3) \cdot \sin(\theta i2).$$

When n2>n3, the light which is applied at an incident angle of θi2' (critical angle) or more defined by sin(θi2')=n3/n2 is not refracted, but totally reflected.

The NA of the projection lens is given by:

$$NA = n1 \cdot \sin(\theta i1).$$

In a general projection exposure apparatus which does not use the immersion technique, since the outer space of the sensor unit is filled with air, the refractive index n1=1. When the refractive index is 1, the NA is less than 1.0, or at most around 0.9. When the NA=0.83, the incident angle θi1=56.44°. When the material of the sealing window 21 is silica glass, the refractive index n2=1.56. By Snell's law, the refractive angle θr1 at the interface between the outer space of the sensor unit and the sealing window 21 is 32.29°. Since θr1=θi2, the incident angle θi2 of the light at the interface between the sealing window 21 and the internal space of the sensor unit is also 32.29°. The critical angle θi2' at the interface between the sealing window and the internal space of the sensor unit is given by:

$$\sin \theta i2' = n3/n2 = 1/1.56 = 0.64.$$

Therefore, since θi2'=39.9° and θi2'>θi2, the light is not totally reflected, but can reach the surface of the light-receiving element.

Alternatively, in the immersion-type projection exposure apparatus, the outer space of the sensor unit is filled with the liquid. Assume that the liquid is pure water. The refractive index of the pure water is 1.44. When the refractive index n1=1.44 in the above example, the incident angle θi1=56.44°, and the refractive index n2=1.56. Hence, by Snell's law, the refractive angle θr1 at the interface between the outer space of the sensor unit and the sealing window 21 is 50.28°. Since θr1=θi2, the incident angle θi2 of the light at the interface between the sealing window 21 and the internal space of the sensor unit is also 50.28°. As described above, the critical angle θi2' at the interface between the sealing window 21 and the internal space of the sensor unit is given by:

$$\sin \theta i2' = n3/n2 = 1/1.56 = 0.64.$$

Therefore, since θi2'=39.9° and θi2'<θi2, the light is totally reflected. The light, which is applied at an incident angle of 39.9° to 50.28°, is totally reflected at the interface, and cannot reach the surface of the light-receiving element. Hence, the light amount cannot be accurately measured by using a total light beam, thus posing a problem. This problem affects not only the illuminance unevenness sensor unit, but also the above-described calibration sensor unit, or the like.

The discussion above is related to the problem in the immersion-type projection exposure apparatus. Alternatively, the projection exposure apparatus having a high NA has a factor which degrades the measurement precision of the conventional sensor unit which does not use the immersion technique. Generally, a photo-sensor has a characteristic to change the sensitivity in accordance with the incident angle of the light at the light-receiving surface. Hence, in the conventional projection exposure apparatus, the total light beam reaches the light-receiving element without total reflection. However, since light having a large incident angle at the light-receiving surface of the sensor is present, the light amount cannot be accurately measured upon reception of the influence of the angle characteristic of the sensitivity, thus posing a problem.

A complex optical system arranged on the sensor can cope with these problems. However, in consideration of the sensor unit disposed on the stage which moves at a high speed while holding the wafer, it is very difficult to implement the complex optical system in terms of weight and space.

SUMMARY OF THE INVENTION

The present invention has been made on the basis of the recognition of the above problems, and has as its exemplified object to detect, at a high precision, a wide-angle light beam, which exits from an optical system having a high NA.

The first aspect of the present invention is directed to a projection exposure apparatus, which has a projection optical system and projects a pattern onto a substrate through the projection optical system, and the apparatus comprises a sensor unit which comprises a light-receiving element for detecting light incident through the projection optical system, a vessel in which the light-receiving element is arranged, and a sealing window which transmits the incident light and seals the vessel. A space between the sealing window and the light-receiving element is filled with a medium having a refractive index, which is greater than one.

According to a preferable embodiment of the present invention, the sensor unit can be arranged not to include an interface at which total reflection of the incident light entering the sensor unit occurs.

According to a preferable embodiment of the present invention, the medium can comprise a liquid, preferably, an inert liquid.

According to a preferable embodiment of the present invention, the liquid can include one of PFE (perfluoroether), PFPE (perfluoropolyether), HFE (hydrofluoroether), and HFPE (hydrofluoropolyether).

According to a preferable embodiment of the present invention, the sensor unit can comprise a member covering the light-receiving element. The member can comprise one of fluoroplastic and glass.

According to a preferable embodiment of the present invention, the apparatus can further comprise a supply unit which supplies the liquid to the sensor unit.

According to a preferable embodiment of the present invention, the apparatus can further comprise a recovery unit which recovers the liquid from the sensor unit.

According to a preferable embodiment of the present invention, the apparatus can further comprise a liquid supply unit which supplies the liquid to a space between the projection optical system and one of the substrate and the sensor unit.

According to a preferable embodiment of the present invention, the apparatus can further comprise a liquid supply unit which supplies the liquid to a space between the projection optical system and one of the substrate and the sensor unit, and a tank which stores the liquid, wherein the liquid in the tank is supplied to both the sensor unit and the liquid supply unit.

According to a preferable embodiment of the present invention, the apparatus can further comprise driving means for aligning the substrate, wherein the liquid also serves as a coolant for cooling the driving means.

According to a preferable embodiment of the present invention, the medium can comprise a solid material such as fluoroplastic or glass.

According to a preferable embodiment of the present invention, the sensor unit can comprise a light-shielding member with a predetermined shape at an incident portion for the incident light. The sealing window can comprise a predetermined light-shielding pattern.

The second aspect of the present invention is directed to a projection exposure apparatus which has a projection optical system and projects a pattern onto a substrate through the projection optical system, and the apparatus comprises a sensor unit which comprises a light-receiving element for detecting light incident through the projection optical system, and a vessel in which the light-receiving element is arranged. The vessel is filled with a solid, which has a refractive index greater than one, and transmits the incident light.

The third aspect of the present invention is directed to a sensor unit comprising a light-receiving element which detects light, and the unit comprises a vessel in which the light-receiving element is arranged, and a sealing window which transmits light incident thereon and seals the vessel. A space between the sealing window and the light-receiving element is filled with a medium having a refractive index, which is greater than one.

According to a preferable embodiment of the present invention, the unit can be arranged not to include an interface at which total reflection of the incident light entering the unit occurs.

According to a preferable embodiment of the present invention, the medium can comprise a liquid or solid. The solid material can comprise fluoroplastic or glass.

The fourth aspect of the present invention is directed to a sensor unit comprising a light-receiving element which detects light, the unit comprising a vessel in which the light-receiving element is arranged. The vessel is filled with a solid, which has a refractive index greater than one, and transmits the light.

The fifth aspect of the present invention is directed to a projection exposure apparatus, which has a projection optical system and projects a pattern onto a substrate through the projection optical system, and the apparatus comprises a sensor unit which comprises a light-receiving element which detects light incident through the projection optical system, a vessel in which the light-receiving element is arranged, and a sealing window which transmits the incident light therethrough and seals the vessel. A space between the sealing window and the light-receiving element is filled with a liquid.

The sixth aspect of the present invention is directed to a projection exposure apparatus which has a projection optical system and projects a pattern onto a substrate through the projection optical system, and the apparatus comprises a sensor unit which includes a light-receiving element which detects light incident through the projection optical system, and a vessel in which the light-receiving element is arranged. The vessel is filled with a solid, which transmits the incident light.

According to a preferable embodiment of the present invention, the solid material can comprise fluoroplastic or glass.

The seventh aspect of the present invention is directed to a sensor unit comprising a light-receiving element which detects light, and the unit comprises a vessel in which the light-receiving element is arranged, and a sealing window which transmits the incident light and seals the vessel. A space between the sealing window and the light-receiving element is filled with a liquid.

The eighth aspect of the present invention is directed to a sensor unit comprising a light-receiving element which detects light, and the unit comprises a vessel in which the light-receiving element is arranged, and a solid which fills the vessel and transmits the light.

According to a preferable embodiment of the present invention, the solid material can comprise fluoroplastic or glass.

The present invention can detect, at high precision, the wide-angle light beam which exits from the optical system having the high NA.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 2:
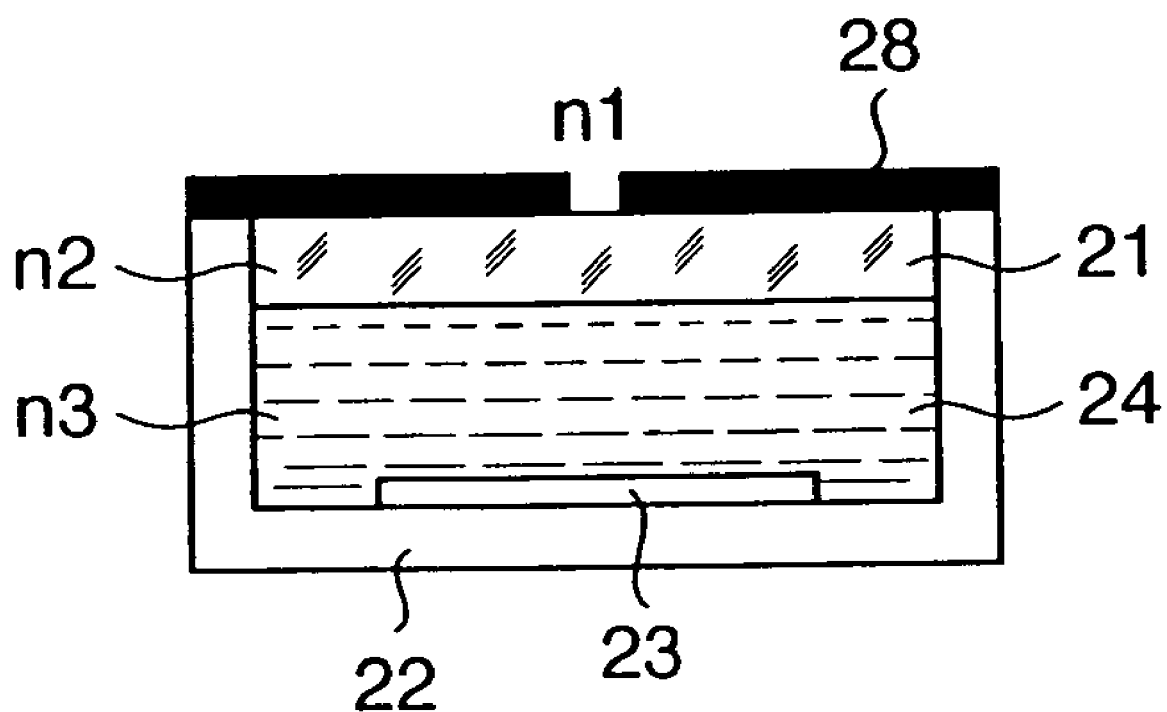
FIG. 2 is a view schematically showing the arrangement of a sensor unit.

First, the principle of the present invention will be described below. FIG. 2 is a view showing the schematic arrangement of a sensor unit (e.g., an illuminance unevenness sensor unit) to which the present invention is applied. In the sensor unit shown in FIG. 2, a light-receiving element 23 is arranged in a sensor vessel 22 sealed by a sealing window 21. The internal space of the sensor unit, i.e., the space between the sealing window 21 and the light-receiving element 23 is filled with a liquid, e.g., a liquid 24 having a refractive index almost equal to that of a liquid used for immersion in wafer exposure. A light shielding member 28, which has a pinhole, is arranged on the sealing window 21. When the light is applied to the sensor unit having this structure, the light is refracted at an interface between the air and the sealing window 21, and an interface between the sealing window 21 and the internal space of the sensor unit.

Assume that the refractive index of the outer space of the sensor unit is n1, the refractive index of the sealing window 21 is n2, the refractive index of the internal space of the sensor unit is n3, the incident angle and refractive angle of the light at the interface between the outer space of the sensor unit and the sealing window 21 are θi1 and θr1, respectively, and the incident angle and refractive angle of the light at the interface between the sealing window 21 and the internal space of the sensor unit are θi2 and θr2, respectively.

In the immersion type projection exposure apparatus, the outer space of the sensor unit is filled with the liquid. Assume that the liquid is pure water (refractive index=1.44). If the refractive index n1=1.44 and NA=0.83, the incident angle qi1 is 56.44°, and the refractive index n2 is 1.56. Hence, by Snell's law, the refractive angle θr1 at the interface between the outer space of the sensor unit and the sealing window 21 is 50.28°. Since θr1=θi2, the incident angle θi2 at the interface between the sealing window 21 and the internal space of the sensor unit is also 50.28°. When the internal space of the sensor unit is filled with the inert liquid having a refractive index n3 of 1.34, the critical angle θi2' at the interface between the sealing window and the internal space of the sensor unit is expressed by:

$$\sin qi2'=n3/n2=1.34/1.56=0.86.$$

Therefore, since θi2'=59.20° and θi2'>θi2, the light is not totally reflected. The total incident light reaches the surface of the light-receiving element 23.

Figure 7:
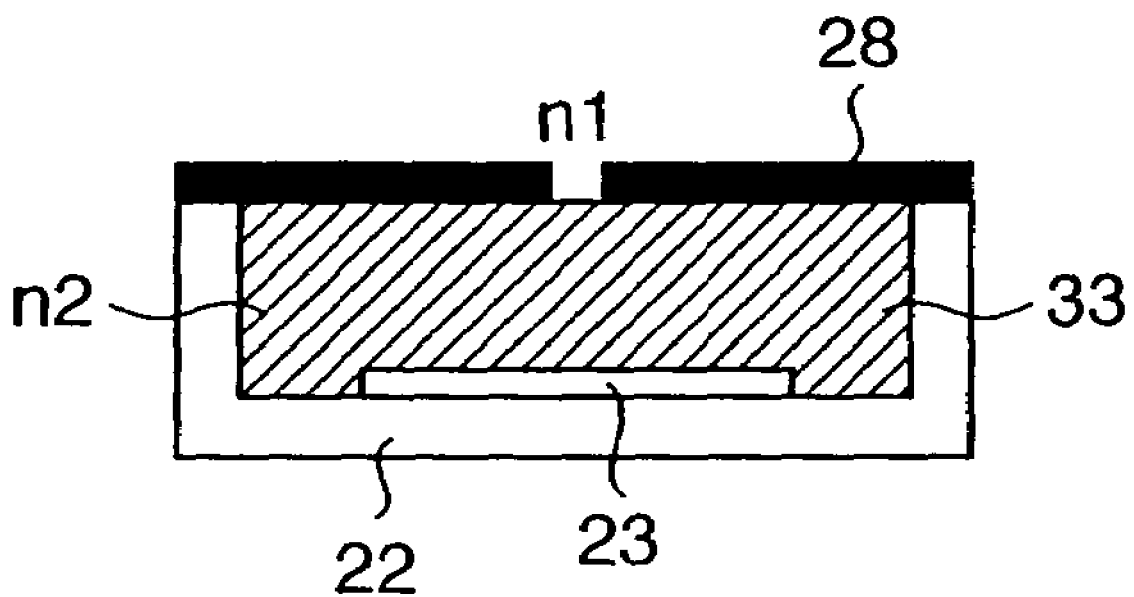
FIG. 7 is a view showing the schematic arrangement of a sensor unit according to the third embodiment of the present invention.

FIG. 7 is a view showing the schematic arrangement of another illuminance unevenness sensor unit to which the present invention is applied. In the sensor unit shown in FIG. 7, the light-receiving element 23 is arranged in the sensor vessel 22. The light-receiving element 23 is coated with a coating member (solid material) 33, and the light-shielding member 28 having a pinhole is arranged on the coating member 33. Preferably, the coating member 33 protects the light-receiving element 23 from the liquid used for immersion, and has a refractive index almost equal to or more than that of the liquid used for immersion. The coating member 33 can also serve as a light-shielding window arranged not to form a space in the sensor unit.

When the light is applied to the sensor unit having this structure, the light is refracted at the interface between the air and the coating member 33. Assume that the refractive index of the outer space of the sensor unit is n1, the refractive index of the coating member 33 is n2, and the incident angle and refractive angle of the light at the interface between the outer space of the sensor unit and the coating member 33 are θi1 and θr1, respectively. In the immersion type projection exposure apparatus, the outer space of the sensor unit is filled with the liquid. Assume that the liquid is pure water (refractive index=1.44). When the refractive index n1=1.44 and the NA=0.83, the incident angle θi1=56.44°. When the refractive index n2 of the coating member 33 is larger than 1.30, the total incident light can be guided into the coating member, and reach the surface of the light-receiving element.

Since the sensor unit exemplified in FIGS. 2 and 7 is incorporated in the immersion-type projection exposure apparatus, even when using the wide-angle incident light, which is applied from the optical system having the high NA to the sensor unit, the incident light can be detected at a high precision in the illuminance unevenness and calibration measurements.

Also, when the sensor unit exemplified in FIGS. 2 and 7 is incorporated in the projection exposure apparatus, which does not use the immersion technique, the incident light can be detected at a high precision in the illuminance unevenness and calibration measurements.

Preferred embodiments will be described below.

First Embodiment

Figure 1:
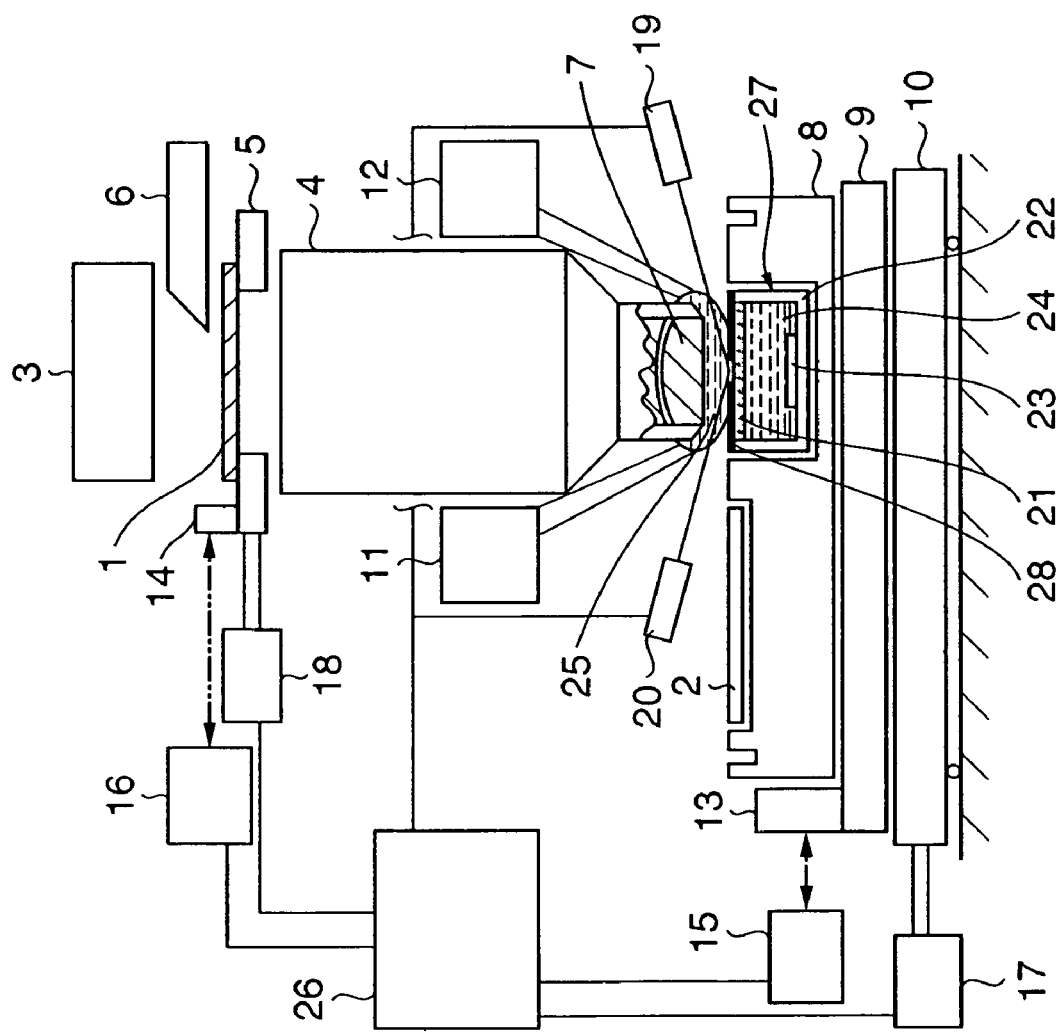
FIG. 1 is a view showing the schematic arrangement of an immersion-type projection exposure apparatus according to the first embodiment of the present invention.

FIG. 1 is a view showing the schematic arrangement of an immersion-type projection exposure apparatus according to the first embodiment of the present invention. The exposure apparatus shown in FIG. 1 illuminates a reticle 1 by using an illumination optical system 3. A circuit pattern formed on the reticle 1 is projected and transferred onto a wafer 2 coated with a photosensitive agent via a projection optical system 4. The illumination optical system 3 can include a modified illumination forming apparatus, a light amount control apparatus, and the like, for projecting the circuit pattern of the reticle 1 onto the wafer 2. The reticle 1 is held on the reticle stage 5, and aligned at a predetermined position. The position of the reticle 1 is measured by a laser interferometer 16 using a reference mirror 14 arranged on the reticle stage 5. A driving motor 18 drives the reticle stage 5.

Information used for aligning the circuit pattern of the reticle 1 and the pattern already formed on the wafer 2 is acquired by using an alignment optical system 6.

The projection optical system 4 includes a plurality of optical elements, and has an optical element 7, which is the last one of these optical elements. Preferably, the lower surface of the optical element 7, i.e., the surface opposing the surface of the wafer 2 is flat, or convex toward the surface of the wafer 2. This contributes to elimination of an air layer or air bubbles left on the surface of the optical element 7 when filling (immersing) the space between the optical element 7 and the wafer 2 or the space between the optical element 7 and a sensor unit 27 with the liquid. The surfaces of the optical element 7 and the photosensitive agent light amount sensor unit 27 on the wafer 2, which are to be immersed, are preferably coated with a lyophilic agent for a liquid 25 used for immersion.

A liquid supply device 12 supplies the liquid 25 into the space between the optical element 7 and the wafer 2 (or the sensor unit 27) to perform the immersion. This liquid 25 is recovered by a liquid recovery device 11.

A wafer chuck 8 holds the wafer 2. This wafer chuck 8 (wafer 2) is driven by an X-Y stage 10 driven by a driving motor 17, and a fine adjustment stage 9 arranged on the X-Y stage 10. The fine adjustment stage 9 includes a tilt function for correcting the position of the wafer 2 in the θ direction, adjusting its position in a Z direction, and correcting its tilt.

The fine adjustment stage 9 has a reference mirror 13 (not shown in the Y direction) for measuring the position in the X and Y directions. By using this, a laser interferometer 15 measures the position of the fine adjustment stage 9 in the X and Y directions. Focus measurement devices 19 and 20 measure the position in the Z direction and the tilt of the wafer 2.

A controller 26 controls the X-Y stage 10, reticle stage 5, focus measurement devices 19 and 20, and the like.

The sensor unit 27 serves as a light amount sensor unit which measures the light amount of the exposure light in the first embodiment. The sensor unit 27 has a light-receiving element 23 arranged in a sensor vessel 22 sealed by a sealing window 21. The internal space of the sensor vessel 22 is filled with an inert liquid 24. The sensor unit 27 may be arranged on the wafer chuck 8, fine adjustment stage 9, or another place, as long as the light amount of the exposure light can be measured. The sealing window 21 on the surface of the sensor unit 27 has a pattern with a pinhole. For example, the sensor unit 27 can be used for measuring the absolute illuminance and illuminance unevenness of the exposure apparatus. Also, the sensor unit 27 can be used for alignment or calibration by changing the shape (mask shape) of the portion through which the light passes on the surface of the sensor unit 27.

Then, the operation of the exposure apparatus shown in FIG. 1 will be described. When measuring the illuminance of the exposure light, the sensor unit 27, serving as the light amount sensor unit, is aligned at the central portion under the projection optical system 4 by driving the X-Y stage 10. Next, the liquid supply device 12 supplies the liquid 25 in the space between the optical element 7 and the sensor unit 27. In this state, the illumination optical system 3 measures the illuminance of the exposure light while exposing the sensor unit 27 via the projection optical system 4. The liquid 25 used for immersion is supplied from the liquid supply device 12 into the space between the optical element 7 and the sensor unit 27, and recovered by the liquid recovery device 11.

The sensor vessel 22 of the sensor unit 27 is filled with the inert liquid 24 having a refractive index almost equal to that of, e.g., the liquid 25 used for immersion. Therefore, even when the exposure light is applied from the projection optical system 4 having the high NA, the total exposure light can reach the light receiving element 23, thereby measuring the luminance at a high precision.

Figure 10:
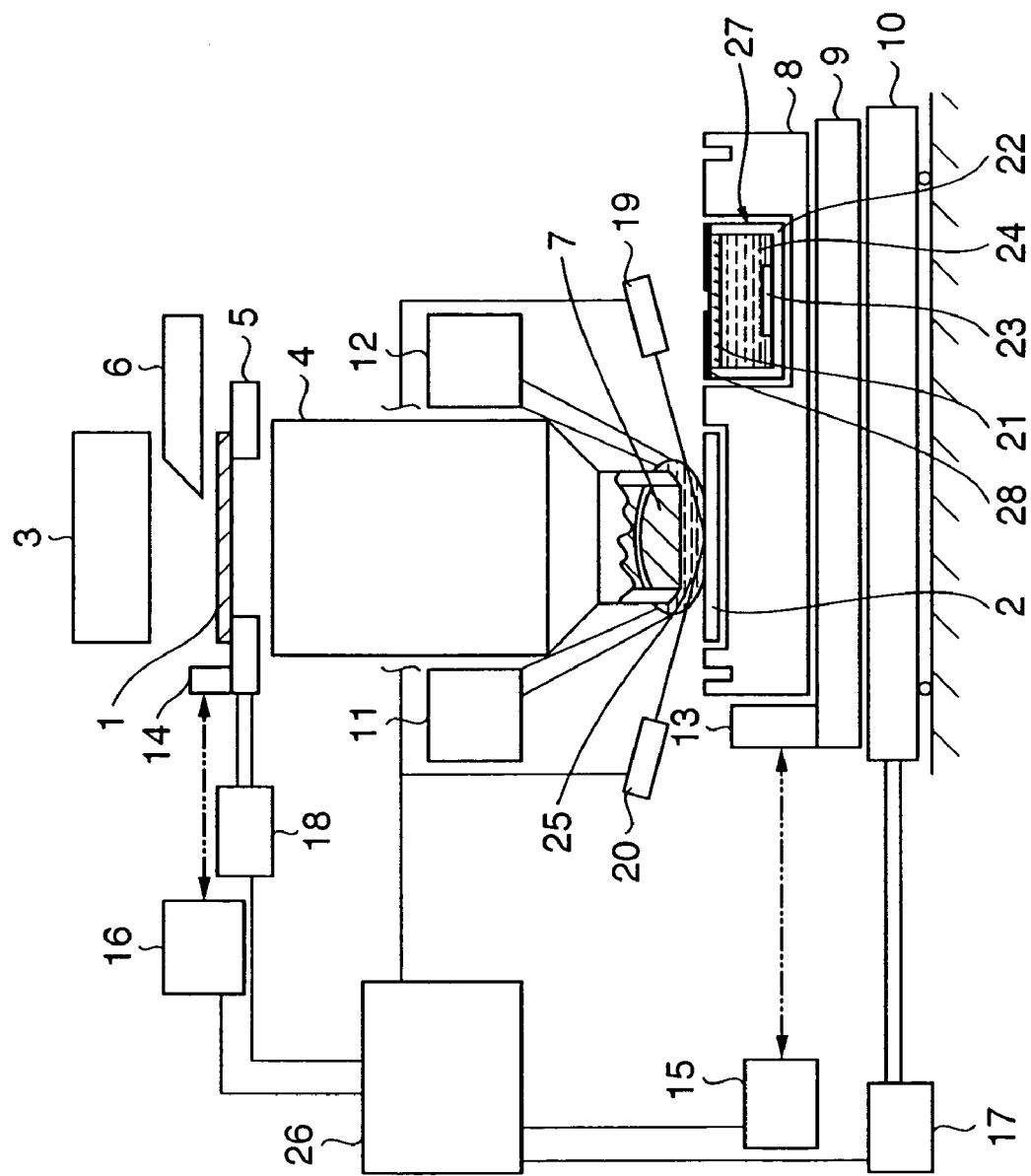
FIG. 10 is a view showing the schematic arrangement of the immersion-type projection exposure apparatus according to the first embodiment of the present invention.

Next, the wafer exposure will be described with reference to FIG. 10. When exposing the wafer, the wafer 2, which is coated with a photosensitive agent in advance, is loaded onto the wafer chuck 8 by using a wafer loading apparatus (not shown). The wafer 2 on the wafer chuck 8 is fixed in a chuck method, such as a vacuum chuck, to perform its surface leveling. The focus measurement devices 19 and 20 then perform focus and tilt measurements of the entire surface of the wafer 2.

In accordance with the focus and tilt measurement information, while the position of the fine adjustment stage 9 is controlled, the liquid supply device 12 supplies the liquid 25 into the space between the optical element 7 and the wafer 2, and the liquid recovery device 11 recovers the supplied liquid 25. The pattern of the reticle 1 is projected on the wafer 2, thereby exposing the wafer 2. After the wafer 2 is completely exposed, the wafer loading apparatus (not shown) recovers the wafer 2 from the fine adjustment stage 9. Then, a series of exposure operations are terminated.

The sensor unit 27 will be described in detail below with reference to FIG. 2. When the sensor unit 27 serves as the light amount sensor unit, the sensor vessel 22 is sealed by the sealing window 21 on which the light-shielding member 28 having a pattern with a pinhole is formed by chromium, and the like, as exemplified in FIG. 3. The light receiving element 23 is arranged in the sensor vessel 22, and the sensor vessel 22 is filled with the liquid, such as the inert liquid 24.

As the material of the sealing window 21, for example, a material (e.g., quartz) through which the exposure light is efficiently transmitted may be used. As the inert liquid 24, for example, a fluorine based inert liquid such as PFE (perfluoroether), PFPE (perfluoropolyether), HFE (hydrofluoroether), HFPE (hydrofluoropolyether), or the like, are preferably available. As the criterion for selecting the material, it is important to have a refractive index almost equal to that of the liquid 25 used for immersion, have a high transmittance for the exposure light, be hardly degraded by the exposure light, and cause no degradation of the characteristic of the light-receiving element 23.

The light shielding member 28, which forms the pattern with the pinhole, can use, e.g., a thin plate having a through hole. This thin plate can be arranged on the surface of or near the sealing window 21. Also, the sensor unit, which is suitable for measuring the alignment or calibration, includes the pattern where a plurality of bars are arrayed, as exemplified in FIG. 4, in place of the pattern having the pinhole. Of course, when the sensor unit is used in another application, the pattern which is suitable for the application may be used.

Figure 5:
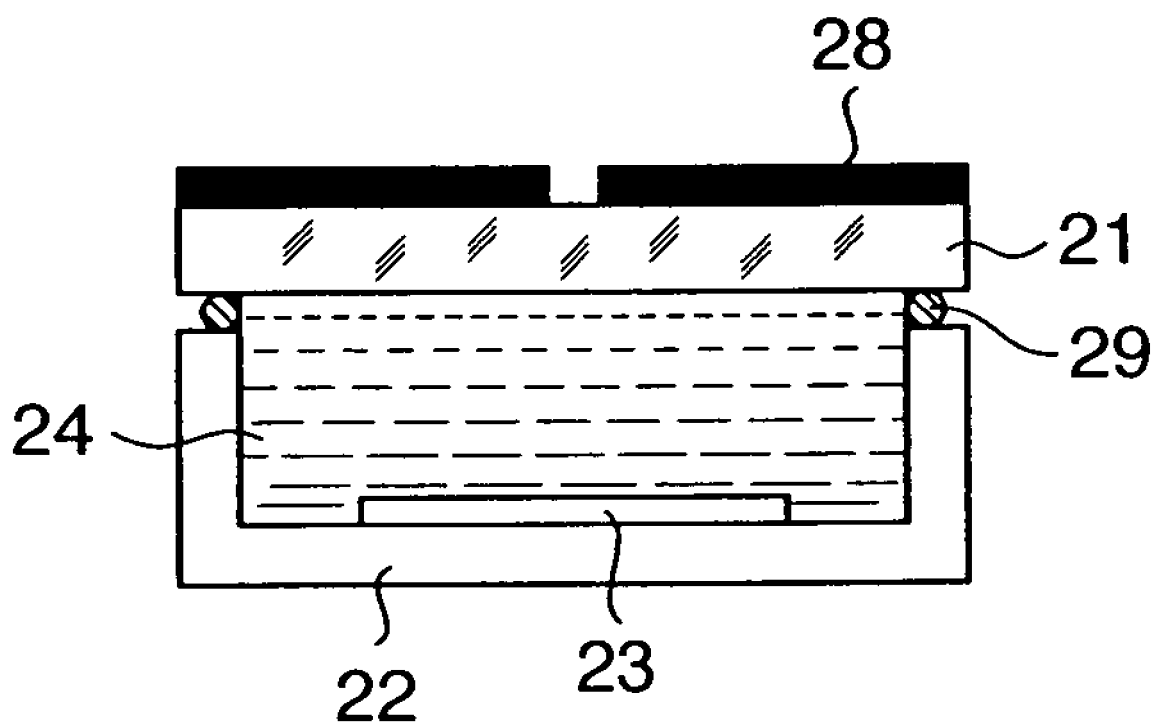
FIG. 5 is a view schematically showing another arrangement of the sensor unit.

Desirably, in the sealing window 21 and the sensor vessel 22, the inert liquid 24 in the sensor unit is not volatilized. As shown in FIG. 5, an O-ring 29 may be arranged at a coupling portion between the sealing window 21 and the sensor vessel 22 to seal the sensor unit, thereby easily separating the sealing window 21 and the sensor vessel 22 as needed. For example, in the structure where the sensor unit 27 is fixed to the wafer chuck 8, when the wafer chuck 8 is to be detached from the exposure apparatus, it may be difficult to disconnect the electrical wiring between the light-receiving element 23 and another unit (e.g., controller 26). Thus, in the sensor unit as shown in FIG. 5, for example, the sealing window 21 is attached to the wafer chuck 8, and the sensor vessel 22 is attached to the fine adjustment stage 9. Hence, the wafer chuck 8 can be detached from the exposure apparatus independently of the electrical wiring from the light-receiving element 23.

Second Embodiment

Figure 3:
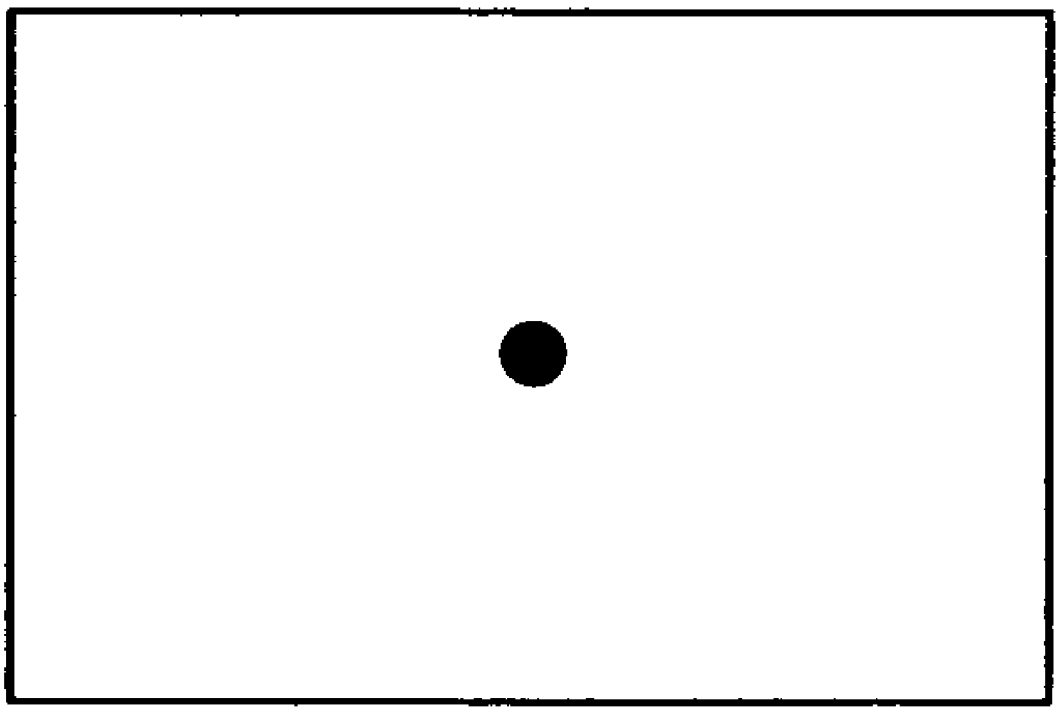
FIG. 3 is a view showing an example of a pinhole pattern applied to the sensor unit.
Figure 6:
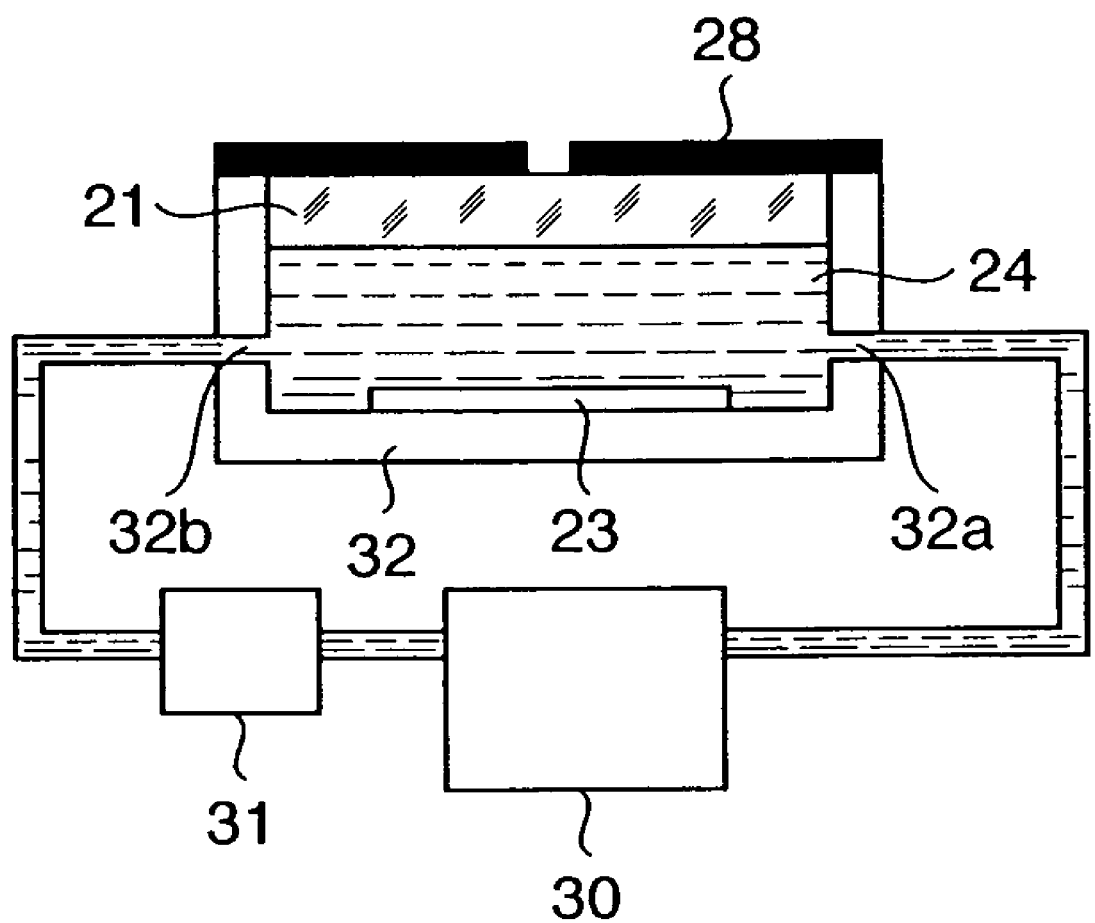
FIG. 6 is a view showing the schematic arrangement of a sensor unit according to the second embodiment of the present invention.

FIG. 6 is a view showing the schematic arrangement of a sensor unit in an immersion type projection exposure apparatus according to the second embodiment of the present invention. The arrangement and operation of the overall apparatus, except for the sensor unit, are the same as those in the first embodiment. In FIG. 6, a sealing window 21, on which a light-shielding member 28 having a pattern with a pinhole, as in FIG. 3, is formed on a surface by chromium, and the like, and a sensor vessel 32 having circulation ports 32*a* and 32*b* separate an internal space from an outer space of a light amount sensor unit 27. A light-receiving element 23 is arranged in the internal space. In this arrangement, an inert liquid 24 is supplied to the internal space of the circulation port 32 to circulate the supplied inert liquid.

In the outer space, a tank 30, which stores the inert liquid 24, and a liquid feeding pump 31, which supplies the inert liquid 24 in the tank 30 to the sensor vessel 32, can be arranged. The pump 31 can always circulate the inert liquid 24 in the sensor vessel 32. Alternatively, the liquid feeding pump 31 may stop in the state where the sensor vessel 32 is filled with the inert liquid 24, and be driven to circulate the inert liquid 24 as needed.

As described above, in the arrangement wherein the inert liquid 24 can be supplied to the sensor vessel 32, the sensor vessel 32 can be refilled with the inert liquid 24, for example, even when the sensor vessel 32 is not filled with a liquid 25, because the inert liquid 24 is volatilized from a gap unintentionally generated at the coupling portion (an O-ring 29 may be arranged as shown in FIG. 5) between the sealing window 21 and the sensor vessel 32. Also, even when the composition of the inert liquid 24 is changed and degraded by illuminating the exposure light for a long time, the liquid can be easily changed. Also, even when the inert liquid 24 is contaminated by an impurity generated from the inner wall of the sensor vessel 32 or the light-receiving element 23, the liquid can be easily changed.

Since a certain amount of the inert liquid 24 is stored and circulated in the tank 30, for example, the total amount of the inert liquid 24 used is larger than that in the first embodiment. Hence, the degradation of the inert liquid 24 caused by the exposure light irradiation or the impurity can be suppressed.

Furthermore, a coolant used for cooing an X-Y stage 10 can serve as the inert liquid 24. When the liquid can serve as both the inert liquid and coolant, the liquid feeding pump and the tank only for the sensor unit are not needed.

Figure 4:
FIG. 4 is a view showing an example of a pattern including a plurality of bars applied to the sensor unit.

In the sensor unit shown in FIG. 6, the pattern shape of the light shielding member 28 can be changed in accordance with the application, as exemplified in FIGS. 3 and 4. For example, the arrangement of the coupling portion between the sealing window 21 and the sensor vessel 32 can change to the arrangement exemplified in FIG. 5.

Third Embodiment

FIG. 7 is a view showing the schematic arrangement of a sensor unit in an immersion-type projection exposure apparatus according to the third embodiment of the present invention. The arrangement and operation of the overall apparatus, except for the sensor unit, are the same as those in the first embodiment.

In the arrangement shown in FIG. 7, a sensor unit 27 includes a light-shielding member 28 having a pattern with a pinhole as in the embodiment of FIG. 3, a sensor vessel 22, a light-receiving element 23, and a coating member 33 (solid material) filled in the sensor vessel 22 to cover the light receiving element 23. Preferably, the coating member 33 is made of a material, which has a refractive index almost equal to or more than that of a liquid 25 used for immersion, has a high transmittance for the exposure light, is hardly degraded by the exposure light, causes no degradation of the characteristic of the light-receiving element 23, and has a resistance to the liquid 25 used for immersion, e.g., a fluoroplastic or glass. In the sensor unit as shown in FIG. 7, the pattern shape of the light-shielding member 28 can change in accordance with the application, as exemplified in FIGS. 3 and 4.

Fourth Embodiment

Figure 8:
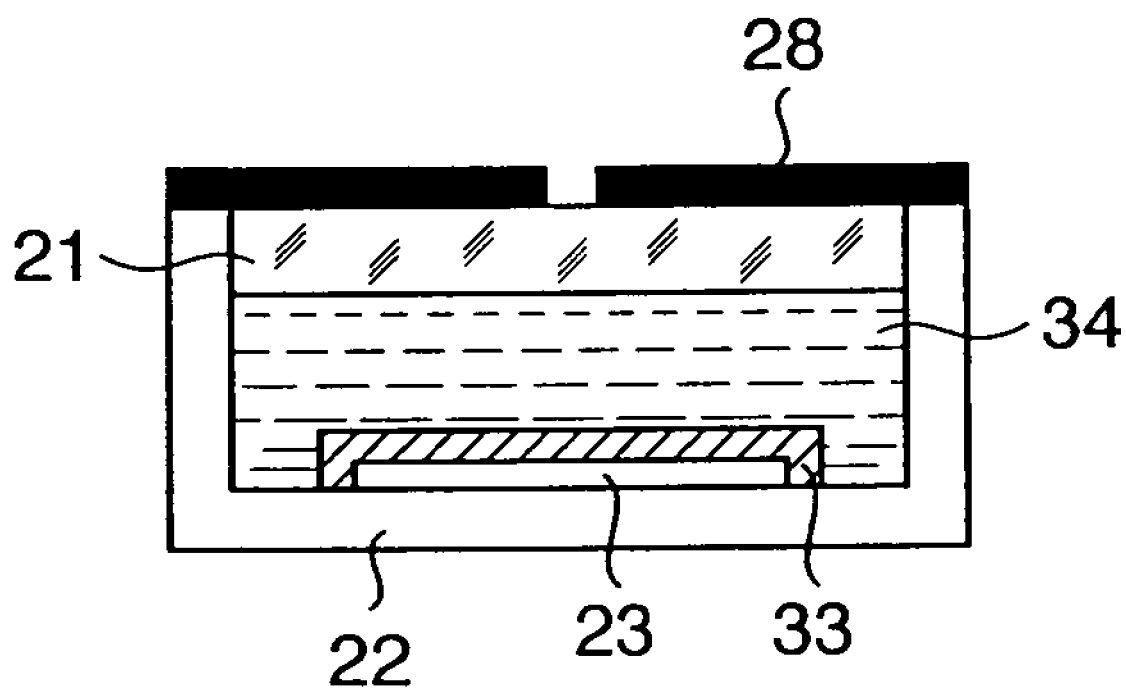
FIG. 8 is a view showing the schematic arrangement of a sensor unit according to the fourth embodiment of the present invention.

FIG. 8 is a view showing the schematic arrangement of a sensor unit in an immersion-type projection exposure apparatus according to the fourth embodiment of the present invention. The arrangement and operation of the overall apparatus, except for the sensor unit, are the same as those in the first embodiment. A sensor unit 27 shown in FIG. 8 includes a sealing window 21, on which a light shielding member 28 having a pattern with a pinhole, as in FIG. 3, is formed on the surface by chromium, and the like, a sensor vessel 22, a light receiving element 23, a coating member 33, which covers the light-receiving element 23, and a liquid 34 filled in the sensor vessel.

Preferably, the coating member (solid material) 33 is made of a material, which has a refractive index almost equal to or more than that of a liquid 34 in the sensor vessel 22, has a high transmittance for the exposure light, is hardly degraded by the exposure light, causes no degradation of the characteristic of the light receiving element 23, and has a resistance to the liquid 34 in the sensor vessel, e.g., a fluoroplastic or glass.

As the liquid 34 for filling the sensor vessel 22, for example, an inert liquid described in the first and second embodiments may be used, or the liquid 25 used for immersion may be directly used. In the sensor unit shown in FIG. 8, the pattern shape of the light shielding member 28 can change in accordance with the application as exemplified in FIGS. 3 and 4. The arrangement of the coupling portion between the sealing window 21 and the sensor vessel 32 can change, as exemplified in FIG. 5.

Fifth Embodiment

Figure 9:
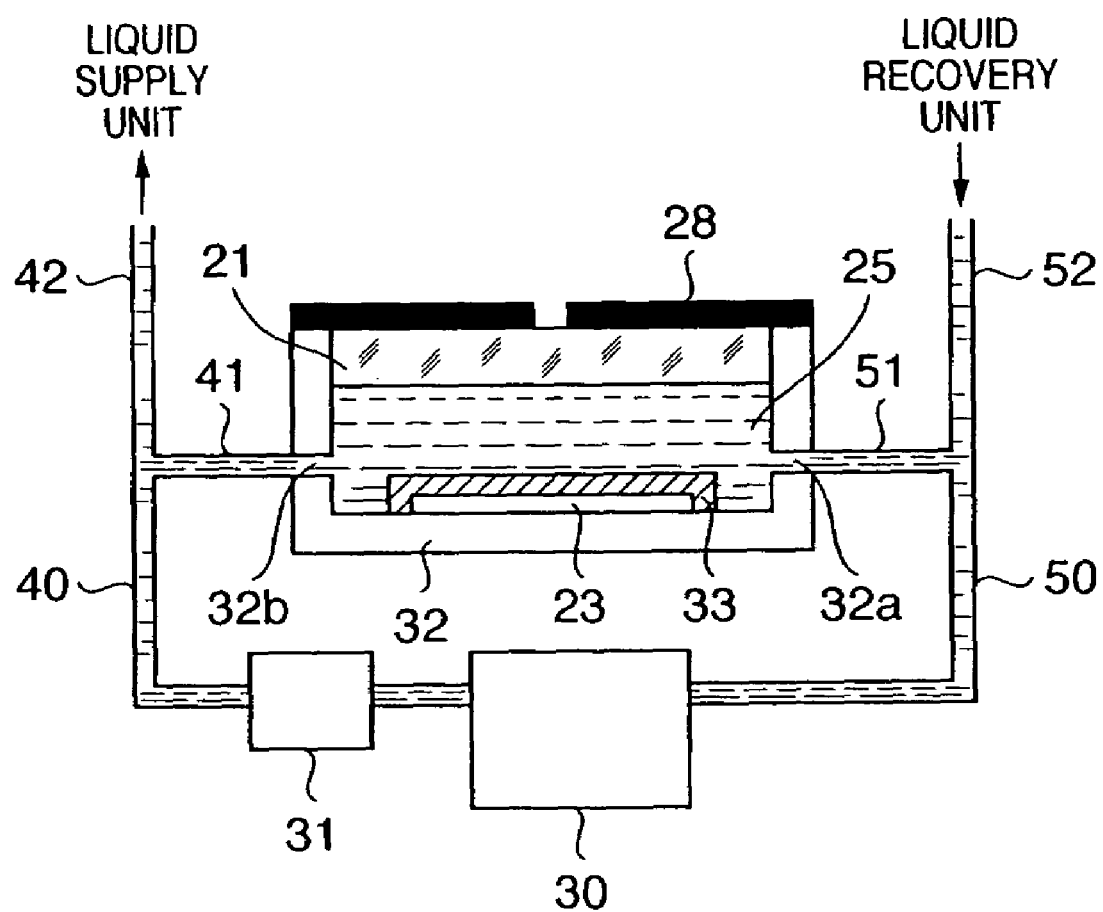
FIG. 9 is a view showing the schematic arrangement of a sensor unit according to the fifth embodiment of the present invention.

FIG. 9 is a view showing the schematic arrangement of a sensor unit, and its environment, in an immersion-type projection exposure apparatus, according to the fifth embodiment of the present invention. The matters except for those described in this embodiment are the same as those in the first embodiment. In FIG. 9, a sealing window 21, on which a light shielding member 28 having a pattern with a pinhole, as in FIG. 3, is formed on a surface by chromium, and the like, and a sensor vessel 32 having circulation ports 32a and 32b separates an internal space from an outer space of a light amount sensor unit 27. A light receiving element 23 is arranged in the internal space, and the light receiving element 23 is coated with a coating member 33. The internal space is filled with a liquid 25, which is the same as that supplied to the space between an optical element 7 and a wafer 2, or the sensor unit.

The liquid 25 is stored in a tank 30, supplied to a liquid supply device 12 by a liquid feeding pump 31 through liquid feeding pipes 40 and 42, and then supplied into the sensor vessel 32 through the liquid feeding pipe 40, a liquid feeding pipe 41, and a port 32b. The liquid 25, supplied into the space between the optical element 7 and the wafer 2, or sensor unit, by the liquid supply device 12, is recovered by a liquid recovery device 11. Then, the recovered liquid is fed to a liquid feeding pipe 52. After that, the liquid 25 supplied to the sensor vessel 32 through the port 32b is fed to a liquid feeding pipe 51 through a port 32a. The fed liquid is returned to the tank 30 through the liquid feeding pipe 50. With this operation, the liquid 25 circulates in the two channels.

Preferably, the coating member 33 is made of a material, which has a refractive index almost equal to or more than that of a liquid 25 in the sensor vessel 32, has a high transmittance for the exposure light, is hardly degraded by the exposure light, causes no degradation of the characteristic of the light receiving element 23, and has a resistance to the liquid 25 used for immersion in the sensor vessel, e.g., a fluoroplastic or glass.

Effectively, the liquid feeding pipes 41 and 51 have valves which can close in the state where the sensor vessel 32 is filled with the liquid 25. In this case, the valves can open as needed, e.g., when the liquid 25 in the sensor vessel 32 is changed.

As described above, in the arrangement wherein the liquid 25 can be supplied to the sensor vessel 32, the sensor vessel 32 can be refilled with the liquid 25, for example, even when the sensor vessel 32 is not filled with the liquid 25 because the liquid 25 is volatilized from the coupling portion between the sealing window 21 and the sensor vessel 32. Also, even when the composition of the liquid 25 is changed and degraded by illuminating the exposure light for a long time, the liquid can be easily changed. Also, even when the liquid 25 is contaminated by an impurity generated from the inner wall of the sensor vessel 32 or the coating member 33, the liquid can be easily changed.

Since a certain amount of the liquid 25 is stored and circulated in the tank 30, the total amount of the liquid 25 used is larger than that in the fourth embodiment. Hence, the degradation of the liquid 25 caused by the exposure light irradiation or the impurity can be suppressed.

In the sensor unit shown in FIG. 9, the pattern shape of the light-shielding member 28 can be changed in accordance with the application, as exemplified in FIGS. 3 and 4. For example, the arrangement of the coupling portion between the sealing window 21 and the sensor vessel 32 can change to the arrangement exemplified in FIG. 5.

The liquid filled in the sensor vessel 32 may be an inert liquid, as described in the first and second embodiments. In this case, the liquid feeding pipes 42 and 52, which respectively communicate with the liquid supply device 12 and the liquid recovery device 111 are generally omitted. Furthermore, a coolant used for cooing an X Y stage 10 can also serve as the inert liquid. When the liquid can serve as both the inert liquid and the coolant, the feeding pump and the tank only for the sensor unit are not needed.

Sixth Embodiment

Figure 11:
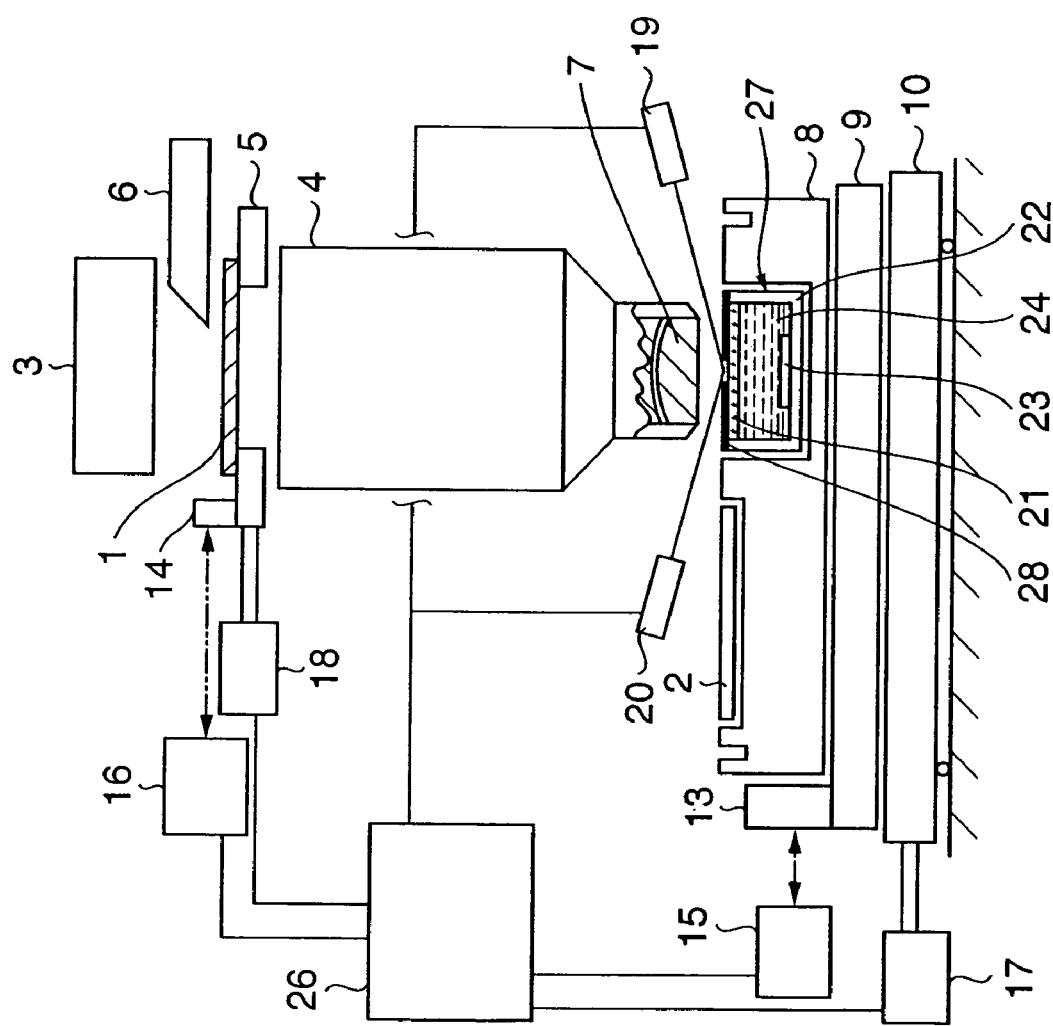
FIG. 11 is a view schematically showing a projection exposure apparatus according to the sixth embodiment of the present invention.
Figure 12:
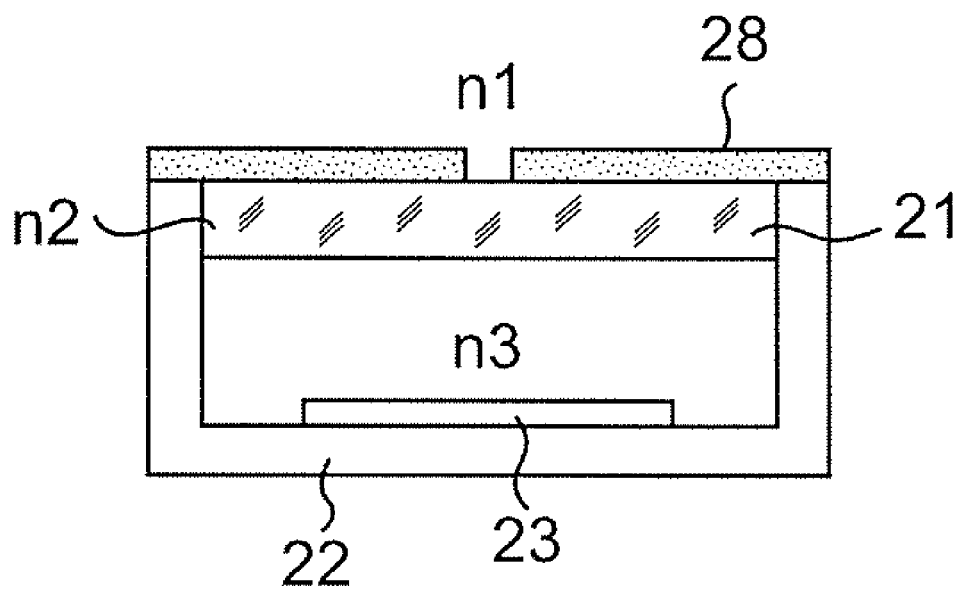
FIG. 12 is a view schematically showing the arrangement of a conventional light amount sensor unit.
Figure 13:
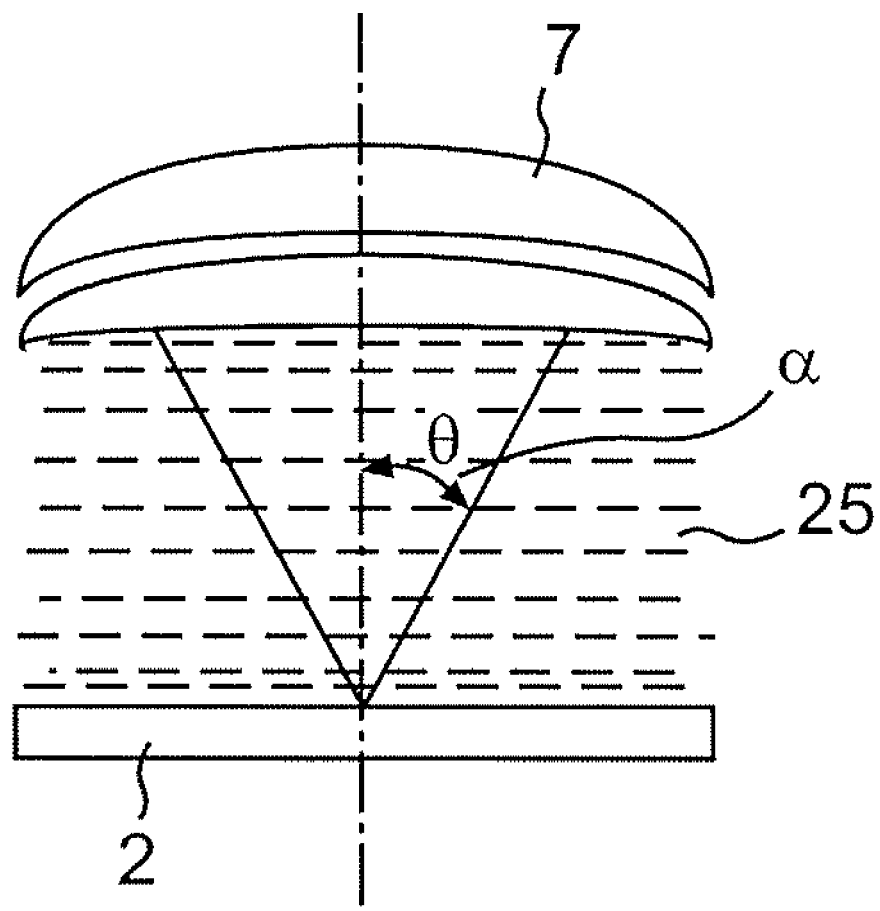
FIG. 13 is a sectional view of the sensor unit for explaining an immersion effect.

FIG. 11 shows the arrangement of a projection exposure apparatus according to the sixth embodiment of the present invention. This projection exposure apparatus is not an immersion type projection exposure apparatus, but serves as a projection exposure apparatus which exposes a wafer under a condition in which the space between an optical element 7 and the wafer is filled with a gas, or under a pressure reduced condition.

The exposure apparatus shown in FIG. 11 illuminates a reticle 1 by using an illumination optical system 3. A circuit pattern formed on the reticle 1 is projected and transferred onto a wafer 2 coated with a photosensitive agent via a projection optical system 4. The illumination optical system 3 can include a modified illumination forming apparatus, a light amount control apparatus, and the like, for projecting the circuit pattern of the reticle 1 onto the wafer 2. The reticle 1 is held on the reticle stage 5, and aligned at a predetermined position. The position of the reticle 1 is measured by a laser interferometer 16 using a reference mirror 14 arranged on the reticle stage 5. Also, a driving motor 18 drives the reticle stage 5.

Information used for aligning the circuit pattern of the reticle 1 and the pattern already formed on the wafer 2 is acquired by using an alignment optical system 6.

A wafer chuck 8 holds the wafer 2. This wafer chuck 8 (wafer 2) is driven by an X Y stage 10 driven by a driving motor 17, and a fine adjustment stage 9 arranged on the X-Y stage 10. The fine adjustment stage 9 includes a tilt function for correcting the position of the wafer 2 in the θ direction, adjusting its position in a Z direction, and correcting its tilt.

The fine adjustment stage 9 has a reference mirror 13 (not shown in the Y direction) for measuring the position in the X and Y directions. By using this, a laser interferometer 15 measures the position of the fine adjustment stage 9 in the X and Y directions. Focus measurement devices 19 and 20 measure the position in the Z direction and the tilt of the wafer 2.

A controller 26 controls the X-Y stage 10, reticle stage 5, focus measurement devices 19 and 20, and the like.

A sensor unit 27 serves as a light amount sensor unit which measures the light amount of the exposure light in the first embodiment. The sensor unit 27 has a light receiving element 23 arranged in a sensor vessel 22 sealed by a sealing window 21. The internal space of the sensor vessel 22 is filled with an inert liquid 24. The sensor unit 27 may be arranged on the wafer chuck 8, fine adjustment stage 9, or another place, as long as the light amount of the exposure light can be measured. The sealing window 21 on the surface of the sensor unit 27 has a pattern with a pinhole. For example, the sensor unit 27 can be used for measuring the absolute illuminance and illuminance unevenness of the exposure apparatus. Also, the sensor unit 27 can be used for alignment or calibration by changing the shape (mask shape) of the portion through which the light passes on the surface of the sensor unit 27.

Then, the operation of the exposure apparatus shown in FIG. 11 will be described. When measuring the illuminance of the exposure light, the sensor unit 27 serving as the light amount sensor unit is aligned at the central portion under the projection optical system 4 by driving the X-Y stage 10. Next, the illumination optical system 3 measures the illuminance of the exposure light while exposing the sensor unit 27 via the projection optical system 4.

The sensor vessel 22 of the sensor unit 27 is filled with the liquid 25 having the refractive index, which is larger than one. Therefore, even when the exposure light is applied from the projection optical system 4 having the high NA, the total exposure light can reach the light receiving element 23, thereby measuring the luminance at a high precision.

Next, the wafer exposure will be described with reference to FIG. 11. When exposing the wafer, the wafer 2, which is coated with a photosensitive agent in advance, is loaded onto the wafer chuck 8 by using a wafer loading apparatus (not shown). The wafer 2 on the wafer chuck 8 is fixed in a chuck method, such as a vacuum chuck to perform surface leveling of the wafer 2. Next, while the focus measurement devices 19 and 20 perform focus and tilt measurements of the entire surface of the wafer 2, and the position of the fine adjustment stage 9 is controlled, the wafer is exposed.

After the wafer 2 is completely exposed, the wafer loading apparatus (not shown) recovers the wafer 2 from the fine adjustment stage 9. Then, a series of exposure operations are terminated. The operation of the sensor unit 27 is the same as that described in the first embodiment. The sensor unit 27 can have the arrangement exemplified in the first to fourth embodiments. Also, in the fifth embodiment, the channels (liquid feeding pipes 42 and 52), respectively connected to the liquid supply device 12 and the liquid recovery device 11, can be eliminated.

Seventh Embodiment

The pattern or structure of the light shielding member 28 of the sensor unit exemplified in the first to the sixth embodiments can change in accordance with an application, or may be eliminated in accordance with a specific application. Also, the sealing window may include a pattern, such as a reference mark pattern. That is, in place of setting a light shielding member in addition to the sealing window, the sealing window itself may have a pattern (light shielding member). Also, the sealing window may have various shapes in addition to a plate shape.

The type of the light receiving element used in the sensor unit is not limited to a specific one. The light receiving element may include a single photodiode, a linear sensor or an area sensor, such as a one- or two-dimensional CCD, or the like.

[Application]

Figure 14:
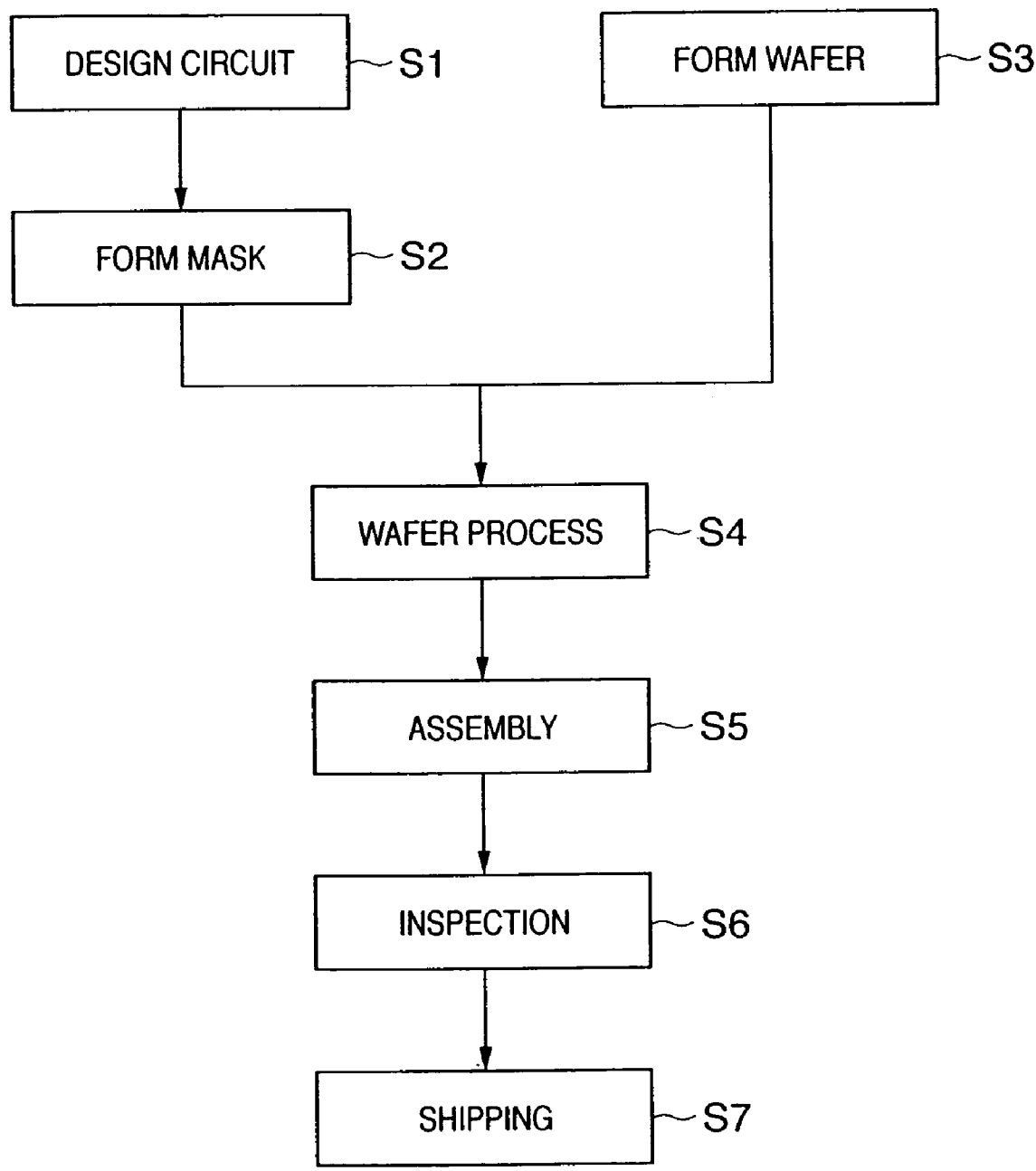
FIG. 14 is a flowchart showing the flow of a manufacturing process of a semiconductor device.

A semiconductor device manufacturing process using the exposure apparatus described above will be explained. FIG. 14 is a view showing the flow of the whole manufacturing process of a semiconductor device. In step 1 (circuit design), a semiconductor device circuit is designed. In step 2 (mask formation), a mask is created on the basis of the designed circuit pattern. In step 3 (wafer formation), a wafer is formed using a material such as silicon. In step 4 (wafer process), called a pre process, an actual circuit is formed on the wafer by lithography using the mask and wafer described above. Step 5 (assembly), called a post process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections, such as an operation confirmation test and a durability test. After these steps, the semiconductor device is completed and shipped (step 7).

Figure 15:
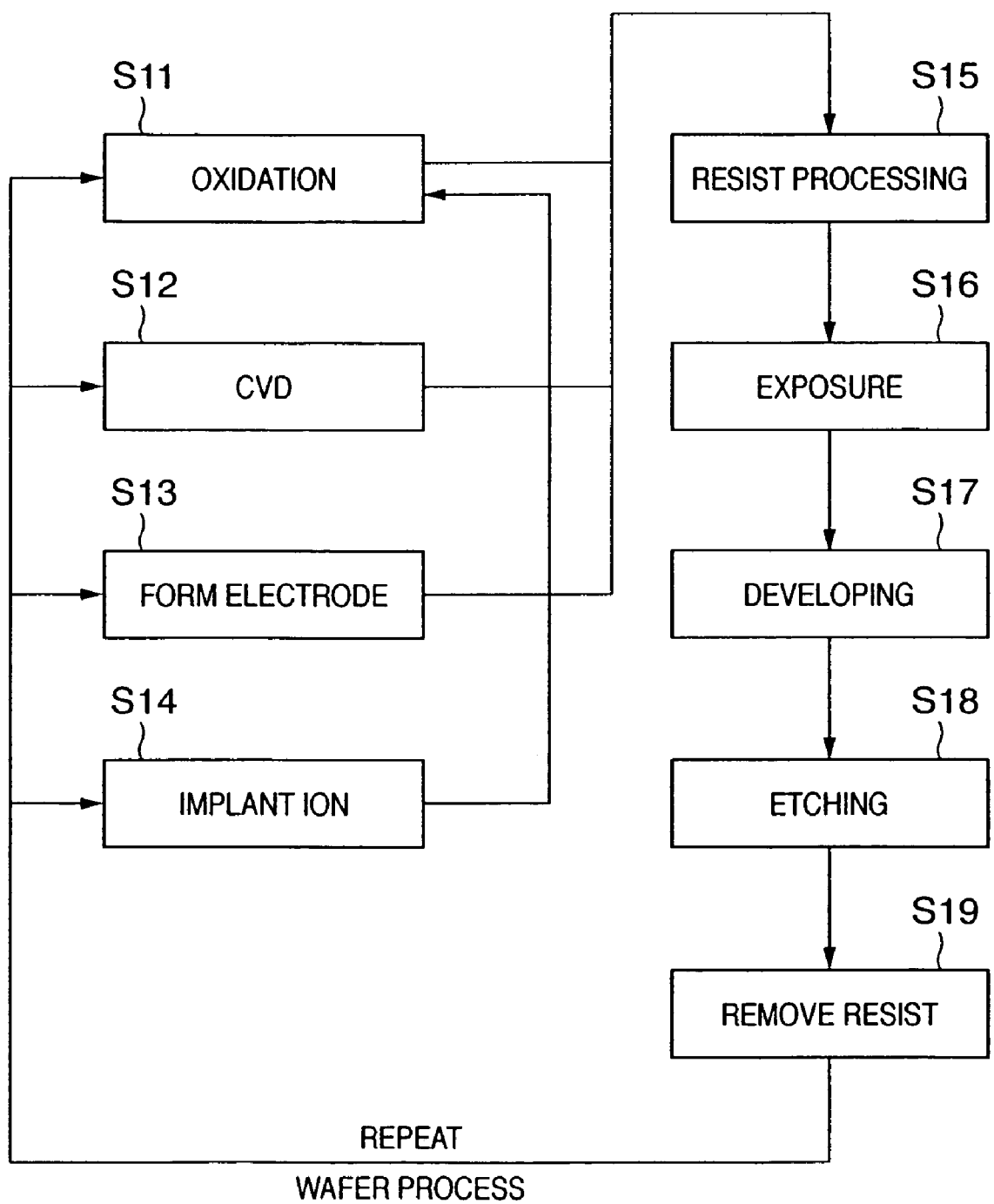
FIG. 15 is a flowchart showing a wafer process in detail.

FIG. 15 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is transferred onto the wafer by the above-mentioned exposure apparatus. In step 17 (developing), a photosensitive agent on the exposed wafer is developed. In step 18 (etching), the resist is etched through an opening portion of the developed resist image. In step 19 (resist removal), an unnecessary resist after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent application No. 2004-32450 filed on Feb. 9, 2004, the entire contents of which is hereby incorporated by reference herein.

The invention claimed is:

1. A projection exposure apparatus which has a projection optical system and projects a pattern onto a substrate through the projection optical system, said apparatus comprising:
   a sensor unit which comprises a light-receiving element for detecting light incident through the projection optical system;
   a vessel in which said light-receiving element is arranged;
   a sealing window which transmits the incident light and seals said vessel; and
   a driving mechanism which aligns the substrate,
   wherein a space between said sealing window and said light-receiving element is filled with a liquid having a refractive index which is greater than one, and the liquid also serves as a coolant for cooling said driving mechanism.

2. A device manufacturing method comprising steps of:
   projecting a pattern onto a substrate using a projection exposure apparatus as defined in claim 1; and
   developing the substrate onto which the pattern has been projected.

3. An apparatus according to claim 1, further comprising a fluoroplastic covering said light-receiving element.

4. An apparatus according to claim 1, wherein said sealing window includes a light shielding member.

5. An apparatus according to claim 1, wherein the liquid is an inert liquid.

6. An apparatus according to claim 1, wherein the inert liquid includes one of PFE (perfluoroether), PFPE (perfluoropolyether), HFE (hydrofluoroether), and HFPE (hydrofluoropolyether).

* * * * *